United States Patent
Chandler

(10) Patent No.: US 6,579,439 B1
(45) Date of Patent: Jun. 17, 2003

(54) ELECTROLYTIC ALUMINUM POLISHING PROCESSES

(75) Inventor: Wayne D. Chandler, Douglasville, GA (US)

(73) Assignee: Southern Industrial Chemicals, Inc., Atlanta, GA (US)

(*) Notice: Subject to any disclaimer, the term of this patent is extended or adjusted under 35 U.S.C. 154(b) by 0 days.

(21) Appl. No.: 10/044,849

(22) Filed: Jan. 11, 2002

Related U.S. Application Data

(60) Provisional application No. 60/261,482, filed on Jan. 12, 2001.

(51) Int. Cl.$^7$ ............... B23H 11/00; B23H 3/00; C25F 3/00; H05K 3/07
(52) U.S. Cl. ............ 205/671; 205/674; 205/675; 205/676; 205/677; 205/680; 205/684
(58) Field of Search ................... 205/640, 660, 205/671, 674, 675, 676, 677, 680, 684, 323, 324, 332

(56) References Cited

U.S. PATENT DOCUMENTS

| | | |
|---|---|---|
| 2,315,695 A | 4/1943 | Faust |
| 3,627,654 A * | 12/1971 | Petit et al. .................. 205/671 |
| 3,970,529 A | 7/1976 | Martin |
| 5,176,803 A | 1/1993 | Barbuto et al. |
| 5,538,600 A | 7/1996 | Schultz et al. |
| 5,616,231 A | 4/1997 | Askin et al. |
| 5,669,980 A | 9/1997 | McNeil et al. |
| 6,117,775 A | 9/2000 | Kondo et al. |

FOREIGN PATENT DOCUMENTS

| | | |
|---|---|---|
| EP | 0 475 026 A1 | 3/1992 |
| JP | A 8105000 | 4/1996 |
| WO | WO 95/20062 | 7/1995 |
| WO | WO 99/10566 | 3/1999 |

OTHER PUBLICATIONS

Dunn et al., "Auger Electron Analysis of Electropolished High Purity Aluminum", *J. Electrochem. Society* (1970) 117(1), 81–2, Dec.

Electrolytic and Chemical Polishing, Chapter 3, pp. 61–93.

Tajiri, K. et al.., "Pit–Free Electropolishing of Aluminum and its Application for Process Chamber" *J. Vac. Sci. Technol.* (1998) 16 (3, Pt 1), 1196–1200.

* cited by examiner

*Primary Examiner*—Roy King
*Assistant Examiner*—Wesley A. Nicolas
(74) *Attorney, Agent, or Firm*—Needle & Rosenberg PC

(57) ABSTRACT

This invention, in one aspect, relates to processes for electropolishing aluminum, in particular, aluminum alloy metal surfaces, by immersing the metal surface in a polishing solution and making the aluminum alloy material anodic. The polishing solution can comprise a phosphoric acid solution and a hypophosphite-containing compound. The polishing solution can also comprise a polyol, a polyol ether and an organic acid.

22 Claims, No Drawings

ELECTROLYTIC ALUMINUM POLISHING PROCESSES

CROSS REFERENCE TO RELATED APPLICATIONS

This application claims priority to U.S. Provisional Application No. 60/261,482, filed on Jan. 12, 2001, which is herein incorporated by this reference in its entirety.

FIELD OF THE INVENTION

This invention relates to processes for electropolishing aluminum or aluminum alloy materials.

BACKGROUND OF THE INVENTION

In many aluminum polishing processes, the aluminum material is polished using a chemical process that does not require electricity to effectuate polishing. However, such polishing processes typically use high temperatures and may require the use of a scrubber to remove nitrous oxide fumes produced by the nitric acid and phosphoric acid components that can be used in such chemical process. Such processes can also be undesirable due to environmental concerns.

While processes using electricity, i.e., electropolishing processes, have been used to polish stainless steel metal surfaces, processes for electropolishing aluminum, in particular, aluminum alloy metal surfaces, have met with limited success due to the general requirement for hazardous or fume producing chemicals, the need for large amounts of electricity to be applied to effect the polishing or adverse effects on the metal surface caused by, for example, etching of the surface.

It would be desirable to have processes for electropolishing aluminum, in particular, aluminum alloy materials, that do not result in noxious and/or toxic fumes, use minimal electricity and do not etch the surface of the metal surface.

SUMMARY OF THE INVENTION

In accordance with the purposes of this invention, as embodied and broadly described herein, this invention, in one aspect, relates to processes for electropolishing aluminum, in particular, aluminum alloy metal surfaces, by immersing the metal surface in a polishing solution and making the aluminum alloy material anodic. The polishing solution can comprise a phosphoric acid solution and a hypophosphite-containing compound. The polishing solution can also comprise a polyol, a polyol ether and an organic acid.

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention as claimed.

DESCRIPTION OF THE INVENTION

The present invention may be understood more readily by reference to the following detailed description of particular aspects of the invention and the Example included therein.

Before the present compounds, compositions, articles, devices, and/or processes are disclosed and described, it is to be understood that this invention is not limited to specific methods or to particular reagents unless otherwise specified, and, as such may, of course, vary. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

A weight percent of a component, unless specifically stated to the contrary, is based on the weight of the formulation or composition in which the component is included.

"Optional" or "optionally" means that the subsequently described event or circumstance may or may not occur, and that the description includes instances where said event or circumstance occurs and instances where it does not. For example, the phrase "optional steps in the process" means that additional step(s) may or may not be adopted and that the description includes processes where the optional step(s) is not included and processes where the optional step(s) is included.

Electropolishing is a method of polishing metal surfaces by applying an electric current through an electrolytic bath, as described, for example, in McGraw-Hill Encyclopedia of Science & Technology, pp. 810–811, 1982. The process is the reverse of electroplating. Anodic dissolution of surface features generally produces a flat, smooth, brilliant surface. One of ordinary skill in the art will recognize that the brilliance of the surface will be largely dependent on the use of the metal. For example, in some aspects, an electropolished surface may be matte or nearly matte; in other aspects, an electropolished surface may be "mirror-like." In further aspects, an electropolished surface may have a brilliance between matte and mirror-like.

Current density on a metal surface can be an important parameter of electropolishing processes, including those disclosed herein. For example, below a certain voltage level, etching can occur; above the etching voltage level, a constant current region is reached where polishing can occur. At even higher voltages, oxygen evolution can interfere with polishing. The present invention applies particularly to electropolishing, but can also be applied to electrolytic etching or electrochemical removal by varying the operating parameters from the polishing region.

The term "aluminum alloy" is used herein to mean pure or substantially pure aluminum metal and alloys thereof in which the amount of aluminum is at least about 85%. Still further, the amount of aluminum in the alloy can be at least about 90% or, still further, at least about 95%. Aluminum alloys that can be electropolished according to the present invention can comprise about 85, 87.5, 90, 92.5, 95, 97.5 or 99% aluminum, where any of the stated values can comprise an upper or lower endpoint, as appropriate.

Aluminum alloys suitable for use in the present invention can contain less than about 2% silicon by weight, as measured by total weight of the aluminum alloy. Still further, the amount of silicon in the aluminum alloy can be less than about 1.5, 1.0, 0.5 or 0.1% by weight, as measured by total weight of the aluminum alloy.

Specific chemical compositions for aluminum alloys available commercially that are suitable for use herein are registered with the Aluminum Association, Inc., which reviews and assigns appropriate alloy designations to the set of chemical compositions. The Aluminum Association maintains registration records that list domestic and internationally registered chemical compositions of aluminum alloys and their corresponding alloy designations. Thus, those skilled in the art would be able to determine the composition of various aluminum alloys specified herein by their respective alloy designations. The records of the Aluminum Association that pertain to aluminum alloys suitable for use in the present invention are incorporated herein by this reference in their entireties. One such source of data is the publication "Aluminum Standards and Data," which is published by the Aluminum Association.

Particular aluminum alloys that may be used in the present invention have Aluminum Association alloy designations in the 1000, 2000, 3000, 5000, 6000 and 7000 series. More specifically, suitable aluminum alloys include, but are not limited to, one or more of: 1050, 1060, 1100, 1145, 1175, 1200, 1230, 1235, 1345, 2024, 2219, 3003, 5252, 5657, 6063, 6061, 6463 and 7075.

In accordance with the present invention, an aluminum alloy may be fabricated into an aluminum alloy material prior to electropolishing. Aluminum alloy materials that can be used in the electropolishing processes of the present invention include, but are not limited to, aluminum alloy sheets, plates, store front assemblages, doors, windows, fixtures, bicycle parts, hand rails, architectural parts for buildings, fittings for automobiles and automotive trim, tools, baseball bats, wheels, extruded parts, or any parts or structures where aluminum alloy is used. It will be apparent from this list that the items can be irregular in shape. Moreover, many of the listed items are significantly longer than they are wide and/or thick. It has been found that the processes of the present invention can be particularly well suited for electropolishing aluminum alloy materials that are irregular in shape or longilateral in shape, i.e., having long sides in relation to the thickness or width. Still further, the processes of the present invention are suitable for electropolishing large aluminum alloy materials that are "one of a kind" or "custom" products.

In one aspect, the invention relates to a process for electropolishing an aluminum alloy material by providing a polishing solution comprising i. from about 55% to about 90% of a phosphoric acid solution, wherein the phosphoric acid solution comprises from about 60% to about 100% phosphoric acid; and ii. from about 0.2% to about 20% of a hyphosphite-containing compound, wherein components i. and ii. are measured out of a total of 100% polishing solution.

The phosphoric acid solution can be present in the polishing solution at from about 55% to about 90%, or at from about 65 to about 80%, as measured out of a total 100% polishing solution. Still further, the phosphoric acid solution can be present in the polishing solution at about 55, 60, 65, 70, 75, 80, 85 or 90%, as measured out of a total of 100% polishing solution, where any of the stated values can comprise an upper or lower endpoint, as appropriate.

The phosphoric acid solution used in the present invention can comprise from about 60% to about 100% phosphoric acid. Still further, the phosphoric acid solution can comprise about 60, 65, 70, 75, 80, 85, 90, 95 or 100% phosphoric acid, where any of the stated values can comprise an upper or lower endpoint, as appropriate. In a further aspect, the phosphoric acid solution is a concentrated phosphoric acid solution.

Hypophosphite-containing compounds that can be used in the polishing solution include, but are not limited to, one or more of: sodium hypophosphite, lithium hypophosphite, potassium hypophosphite, magnesium hypophosphite, calcium hypophosphite, manganese hypophosphite, aluminum hypophosphite, barium hypophosphite and ammonium hypophosphite. One of ordinary skill in the art will recognize that other hypophosphite salts may be used in the present invention.

Hypophosphite-containing compounds can be present in the polishing solution at from about 0.2% to about 20%, or at from about 0.2% to about 5.0%, as measured out of a total of 100% polishing solution. Still further, the hypophosphite-containing compounds can be present in the polishing solution at about 0.2, 0.5, 1, 1.5, 2, 2.5, 3, 3.5, 4, 4.5, 5, 6, 7, 8, 9, 10, 15 or 20%, as measured out of a total of 100% polishing solution, where any of the stated values can comprise an upper or lower endpoint, as appropriate.

Polyols that can be used in the polishing solution can include aliphatic polyols having from 2 to 20 carbon atoms or cycloaliphatic polyols having from 4 to 20 carbon atoms. Specific examples of such polyols include, but are not limited to, one or more of: ethylene glycol, diethylene glycol, triethylene glycol, polyethylene glycol, glycerol, propanediols, 1,3-propanediol, 2-methyl-1,3-propanediol, propylene glycol, polypropylene glycol, butanediols, 1,2-butanediol, 1,4-butanediol, pentanediols, 1,2-pentanediol, 1,3-pentanediol, 1,4-pentanediol, 1,5-pentanediol, 2,3-pentanediol, 2,4-pentanediol, 3-methyl-2,4-pentanediol, 2-methyl-1,3-pentanediol, 2-methyl-1,4-pentanediol, 2-2-4-trimethyl-1,3-pentanediol, 1,3-hexanediol, 1,6-hexanediol, 1,7-heptanediol, 1,8-octanediol, 1,9-nonanediol, neopentyl diol, pentaerythritol, 1,4-di-(hydroxyethoxy)-benzenediol, 2,2-bis-(4-hydroxycyclohexyl)-propanediol, cis- or trans-2,2,4,4-tetramethyl-1,3-cyclobutanediol, cyclopentanediols and cis- or trans-cyclohexanedimethanol.

Polyols can be present in the polishing solution at from about 2% to about 30%, or at from about 5% to about 15%, as measured out of a total of 100% polishing solution. Still further, the polyols can be present in the polishing solution at about 2, 5, 10, 15, 20, 25 or 30%, as measured out of a total of 100% polishing solution, where any of the stated values can comprise an upper or lower endpoint, as appropriate.

Polyol ethers that can be used in the polishing solution can include alkyl cycloalkyl mono or polyethers of the above-mentioned polyols. Specific examples of such polyol ethers include, but are not limited to, one or more of: ethylene glycol n-butyl ether, ethylene glycol dimethyl ether, ethylene glycol diethyl ether, ethylene glycol methyl ether, ethylene glycol ethyl ether, ethylene glycol methyl ether acetate, ethylene glycol ethyl ether acetate, diethylene glycol methyl ether, diethylene glycol ethyl ether, diethylene glycol dimethyl ether, diethylene glycol diethyl ether, diethylene glycol n-butyl ether, triethylene glycol dimethyl ether, propylene glycol n-butyl ether and dipropylene glycol monomethyl ether.

Polyol ethers can be present in the polishing solution at from about 1% to about 15%, or at from about 1% to about 10%, as measured out of a total of 100% polishing solution. Still further, the polyol ethers can be present in the polishing solution at about 1, 2, 5, 10 or 15%, as measured out of a total of 100% polishing solution, where any of the stated values can comprise an upper or lower endpoint, as appropriate.

Organic acids that can be used in the polishing solution can include, but are not limited to, one or more of: acetic acid, α-hydroxy carboxylic acids, hydroxy acetic acid, glycolic acid, lactic acid, tartaric acid, glyceric acid, malic acid, maleic acid, mandelic acid, citric acid, ascorbic acid, succinic acid, gluconic acid, formic acid, pyruvic acid, propanoic acid, palmitic acid, butyric acid, oxalic acid, fumaric acid and itaconic acid.

Organic acids can be present in the polishing solution at from about 2% to about 20%, or at from about 5% to about 15%, as measured out of a total of 100% polishing solution. Still further, the organic acids can be present in the polishing solution at about 2, 5, 10, 15 or 20%, as measured out of a total of 100% polishing solution, where any of the stated values can comprise an upper or lower endpoint, as appropriate.

In one aspect, each of the components of the polishing solution can be supplied in one solution. Such a solution is available as product EP8537 from SIC Technologies, Inc., Atlanta, Ga. In another aspect, a first solution comprising a phosphoric acid solution can be mixed with a second solution comprising a hypophosphite-containing compound, a polyol, a polyol ether, an organic acid and water. Such a second solution, which comprises a hypophosphite-containing compound, a polyol, a polyol ether, an organic acid and water, is available as product EP8539 from SIC Technologies, Inc., Atlanta, Ga. In a further aspect, each of the components can be supplied individually and mixed together to form the polishing solution. In yet another aspect, a first component comprising one or more hypophosphite-containing compounds can be added to a second solution comprising phosphoric acid solution, a polyol, a polyol ether, an organic acid and water. Such a first component, which comprises one or more hypohphosphite-containing compounds, is available in solid form as EP8559 or in liquid form as EP8560 from SIC Technologies, Inc., Atlanta, Ga. One of ordinary skill in the art will recognize that other combinations are possible, however; any different combinations of materials will not affect the results provided by the polishing solution.

In one aspect of the present invention, the polishing solution can comprise from about 2 to about 40 grams of dissolved aluminum per liter of polishing solution. Still further, the polishing solution can comprise from about 2, 5, 10, 15, 20, 25, 30, 35 or 40 grams of dissolved aluminum per liter of polishing solution, where any of the stated values can comprise an upper or lower endpoint, as appropriate. Still further, the polishing solution can comprise from about 2 to about 10 grams of dissolved aluminum per liter of polishing solution.

Not wishing to be bound by theory, it is believed that during electropolishing, the dissolved aluminum in the polishing solution can be converted to aluminum phosphate. It is believed that some aluminum phosphate in the polishing solution can be beneficial to the electropolishing process. Thus, in some aspects, it may be appropriate to monitor the amount of dissolved aluminum in the electropolishing solution.

In some aspects, it may be necessary to remove excess dissolved aluminum from the polishing solution in order to maintain the stated range. This is due to a probable build-up over time of dissolved aluminum in the polishing solution. For example, the racks used to secure the aluminum alloy materials will typically dissolve in the polishing solution over time, thus increasing the dissolved aluminum content; also, electropolishing aluminum alloy materials for an excessively long time, at, for example, higher current densities, can result in an increase in dissolved aluminum. A "slush ice" in the polishing solution, sometimes located near the top, can be indicative of excessive dissolved aluminum. This condition can be exacerbated by low water content in the polishing solution. When this occurs it can be necessary to remove a portion of the polishing solution from the tank and to add sufficient new polishing solution to bring the dissolved aluminum content back into the stated range.

To achieve the electropolishing of an aluminum alloy material, the processes of the present invention incorporate a container, i.e., tank or vat, that contains the polishing solution. The tank is typically set up electrically in the manner of an anodizing bath. Such a configuration would be readily recognized by one of ordinary skill in the art. The tank can be constructed of PVC, polyethylene, polypropylene, or stainless steel 304 or 316. Also, the tank can be constructed of steel with a PVC, polyethylene, polypropylene, fiberglass, or Koroseal lining. The size of the tank can vary according to variables such as, for example, the size, shape and type of aluminum alloy material to be electropolished.

Lead or 300 series stainless steel, such as 304 or 316, counter electrode(s) may be used and are adequate for conducting the processes of the present invention. In one or more aspects, the ratio of the counter electrode(s) to anode area, i.e., the surface area of the aluminum alloy material, can exceed the anode area of at least 2 to 1 or from 3 or 4 to 1, if possible.

In a significant aspect of the present invention, a mechanical force is applied to the polishing solution during the electropolishing process, thereby providing an agitated polishing solution. Agitation should be substantially complete and substantially uniform so as to ensure that the polishing solution contacts all or substantially all of the outer surface of the aluminum alloy material for a substantial period of the electropolishing process. Agitation of the polishing solution can be particularly useful when polishing aluminum alloy materials that are irregular in shape or longilateral in shape, as discussed elsewhere herein.

Agitation can be accomplished by aeration or air agitation, work-rod agitation, or by mechanical mixing, stirring, and/or shaking. Air back pressure at from about 0.2 kPa to about 0.7 kPa has been found to be suitable for air agitation. Still further, air back pressure at about 0.2, 0.3, 0.4, 0.5, 0.6 or 0.7 kPa can be used to agitate the polishing solution, where any of the stated values can comprise an upper or lower endpoint, as appropriate.

It can be particularly advantageous that the agitation of the polishing solution be vigorous. Vigorous air agitation of the polishing solution can, in one aspect, be measured by a visible increase of from about 10% to about 25% in the volume of the polishing solution. Vigorous agitation can eliminate gas streaks, pockets, and burning and allows higher current densities to be used, thus decreasing the time required to electropolish to the desired finish. When vigorous agitation is used, the aluminum alloy materials should be racked securely.

To electropolish the aluminum alloy material in the processes herein, the material can be immersed in the agitated polishing solution.

The polishing solution can be maintained at a temperature of from about 100° F. to about 200° F. (38° C. to 93° C.), more typically from about 120° F. to about 200° F. (49° C. to 93° C.). Still further, the polishing solution can be maintained at a temperature of about 100, 110, 120, 130, 140, 150, 160, 170, 180, 190 or 200° F., where any of the stated values can comprise an upper or lower endpoint, as appropriate. It has been found that use of lower temperatures can result in longer polishing times and can necessitate the application of higher voltages to generate the desired current density for electropolishing. High temperatures generally allow higher current densities, and thus a brighter finish in a shorter time. Thus, in some aspects, use of a higher temperature of about 150° F. (66° C.) can be desirable.

The polishing solution can be heated by passing steam through lead coils, carbate, tantalum or type 316 stainless steel pipe or plate type coils. Electric immersion heaters such as quartz, Carpenter "20" or Hastellow "C" can also be used to heat the polishing solution.

While immersed in the polishing solution, the aluminum alloy material can be electropolished for from about 2 minutes to about 60 minutes, or for from about 2 minutes to about 30 minutes. Still further, the aluminum alloy material can be electropolished for about 2, 5, 10, 15, 20, 25, 30, 35, 40, 45, 50 or 60 minutes, where any of the stated values can comprise an upper or lower endpoint, as appropriate.

In a further aspect, the aluminum alloy material is made anodic by applying a DC current concurrently with the immersing step. The voltage typically applied can range from about 10 volts to about 48 volts, or from about 12 volts to about 24 volts. Still further, the voltage can be about 10, 12, 14, 16, 18, 20, 22, 24, 26, 28, 30, 32, 34, 36, 38, 40, 42, 44, 46 or 48 volts, where any of the stated values can comprise an upper or lower endpoint, as appropriate. The appropriate amount of voltage will vary according to a number of variables such as, for example, the type, size and shape of the aluminum alloy material, the concentration of the polishing solution components or the temperature of the polishing solution. However, the voltage amounts to be applied can be determined by one of ordinary skill in the art without undue experimentation.

In a significant aspect, the voltage applied is sufficient to provide a current density of at least about 10 amps per square foot of the aluminum alloy material. In another aspect, the current density of the aluminum alloy material can be at from about 10 amps/ft$^2$ to about 80 amps/ft$^2$, or at from about 20 amps/ft$^2$ to about 40 amps/ft$^2$. Still further, the current density of the aluminum alloy material can be at about 10, 20, 30, 40, 50, 60, 70 or 80 amps/ft$^2$, where any of the stated values can comprise an upper or lower endpoint, as appropriate.

The DC current can be supplied by, for example, rectifiers or low voltage motor generator sets as commonly used in the art. There should be a means for controlling the voltage. Usually, the same or similar type of electric equipment used in the art of anodizing can be used in electropolishing processes herein.

During the electropolishing process, it is typical that most of the impurities plate out onto the counter electrode(s) so that only a minor amount of sludge is produced in the polishing solution. However, it may be necessary, from time to time to remove sludge from the polishing solution.

After use, the polishing solution can be maintained within the ranges disclosed herein by the addition of one or more of the following materials: phosphoric acid solution, polyol, polyol ether, organic acid, hypophosphite-containing compound or water. Specific gravity measurements can be a useful indicator of the total content of metal salts, electrolyte and water in the polishing solution. In some aspects, the polishing solution specific gravity can be maintained in the range of from about 1.500 to about 1.670, which is a range conforming to a suitable concentration of components in the polishing solution.

In another aspect of the present invention, the aluminum alloy material may optionally be subjected to one or more cleaning steps prior to immersion in the polishing solution. Cleaning of the aluminum alloy material removes commonly encountered dirt, soil, grime, oil, or other undesirable matter that could cause uneven polishing and perhaps cause a film or scum to float on the polishing solution. If such a film develops, it can be skimmed off, since when unfinished parts are introduced into the polishing solution they may pick up the scum and cause an uneven polished appearance.

Cleaning of the aluminum alloy material can be accomplished by dipping or soaking the material in a suitable cleaning solution comprising common non-etching cleaner, such as any alkaline cleaner, or phosphoric acid cleaner and/or rinsing with water. Suitable cleaners comprise CLEANER 3390 and CLEANER 3354, available from SIC Technologies, Inc., Atlanta, Ga. Several cleaning steps may be required with particularly soiled aluminum alloy materials, as would typically be found when renovating or restoring certain aluminum alloy materials.

The term "smut" refers to the fine particulate material that may be left on the metal material after completion of an etching, anodizing or electropolishing process. One of ordinary skill in the art would recognize that the composition of smut on an aluminum alloy material can vary with the alloy type and with the electrochemical composition used to polish the alloy, but is generally composed of one or more oxides of the alloying metals. Smut typically dulls the metal surface and can lessen the polish of an aluminum alloy surface. As used herein, the term "desmutting" refers to the process or step of removing the fine particulate material left on the metal, i.e., smut, after the completion of an etching, anodizing or electropolishing process.

In another aspect of the present invention, the aluminum alloy material may optionally be subjected to one or more desmutting treatments prior to immersion in the polishing solution. Although desmutting can typically be carried out after electrolytic processes, it has been surprisingly found that performing one or more desmutting treatments prior to electropolishing enhances the polished appearance of the aluminum alloy materials treated in the polishing solution described herein, especially if subsequent anodizing processes are to be performed.

Desmutting products are commercially available, and desmutting compositions and processes are described in U.S. Pat. No. 5,417,819, which is incorporated herein by this reference in its entirety. In one aspect, a desmutting solution can comprise one or more of the following: from about 20% to about 40% of an oxidizing metal salt; from about 1% to about 20% of a strong acid or mixtures of strong acids; from about 0.1% to about 2% of a peroxide, persulfate and/or perborate; and from about 0.1% to about 3% of ammonium bifluoride, as measured out of a total of 100% desmutting solution, where water makes up the balance.

Oxidizing metal salts that can be present in the desmutting solution can include, but are not limited to, ferric sulfate. One of ordinary skill in the art will recognize that other oxidizing metal salts that are functionally equivalent or similar to ferric sulfate can also be used.

Oxidizing metal salts can be present in the desmutting solution in an amount of from about 20% to about 40%, as measured based on a total of 100% desmutting solution. Still further, oxidizing metal salts can be present in an amount of about 20, 25, 30, 35 or 40%, as measured based on a total of 100% desmutting solution, where any of the stated values can comprise an upper or lower endpoint, as appropriate.

Strong acids that can be present in the desmutting solution can include, but are not limited to, one or more of the following: sulfuric acid, nitric acid, hydrofluoric acid, hydrochloric acid and phosphoric acid. In one aspect, the desmutting solution contains one or a mixture of strong acids.

Strong acids can be present in the desmutting solution in an amount of from about 1% to about 20%, as measured based on a total of 100% desmutting solution. Still further, strong acids can be present in an amount of about 1, 5, 10, 15 or 20%, as measured based on a total of 100% desmutting solution, where any of the stated values can comprise an upper or lower endpoint, as appropriate.

Peroxides, persulfates and/or perborates that can be present in the desmutting solution can include, but are not limited to, one or more of the following: hydrogen peroxide, potassium persulfate, ammonium persulfate and sodium perborate.

Peroxides, persulfates and/or perborates can be present in the desmutting solution in an amount of from about 0.1% to about 2%, as measured based on a total of 100% desmutting solution. Still further, peroxides, persulfates and/or perborates can be present in an amount of about 0.1, 0.5, 1.0, 1.5 or 2%, as measured based on a total of 100% desmutting solution, where any of the stated values can comprise an upper or lower endpoint, as appropriate.

Ammonium bifluoride can be present in the desmutting solution. One of ordinary skill in the art will recognize that materials that are functionally similar or equivalent to ammonium bifluoride can also be used in the desmutting solution.

Ammonium bifluoride can be present in the desmutting solution in an amount of from about 0.1% to about 3%, as measured based on a total of 100% desmutting solution. Still further, ammonium bifluoride can be present in an amount of about 0.1, 0.5, 1.0, 1.5, 2.0, 2.5 or 3.0%, as measured based on a total of 100% desmutting solution, where any of the stated values can comprise an upper or lower endpoint, as appropriate.

In one aspect, suitable desmutting solutions can comprise ferric sulfate, hydrogen peroxide, nitric acid, sulfuric acid and ammonium bifluoride. One suitable desmutting solution is DESMUTT 1015, available from SIC Technologies, Inc., Atlanta, Ga. The desmutting solution can be used neat. In another aspect, the desmutting solution can be used at from about 15% to about 35% by volume desmutting solution, with a balance of water. Still further, the desmutting solution can be used at about 15, 20, 25 or 30% by volume desmutting solution, where any of the stated values comprises an upper or lower endpoint, as appropriate.

Desmutting prior to electropolishing can be accomplished by immersing the aluminum alloy material in a suitable desmutting solution prior to immersing in the polishing solution. The immersing can be immediately prior to the electropolishing process or one or more rinsing or cleaning steps may be present after the desmutting step and prior to the electropolishing step. In one aspect, the aluminum alloy material can be immersed a suitable desmutting solution for from about 5 minutes to about 40 minutes. Still further, the aluminum alloy material can be immersed in a suitable desmutting solution for about 5, 10, 15, 20, 25, 30, 35 or 40 minutes, where any of the stated values may comprise an upper or lower endpoint as appropriate. In another aspect, the aluminum alloy material is immersed in a suitable desmutting solution for from about 20 minutes to about 30 minutes prior to immersing in the polishing solution.

After electropolishing, the aluminum alloy material is removed from the polishing solution and may optionally be rinsed in water, desmutted, and/or anodized. A desmutting step subsequent to the electropolishing process can be particularly beneficial for aluminum alloys comprising a high copper content. Optional processing of the aluminum alloy material can include application of a protective coating that can extend the polish of the aluminum alloy material. Treatments that provide protective coatings include, but are not limited to, painting, roll coating, electrocoating and lacquering. Such treatments are well known to one of ordinary skill in the art and, as such, are not discussed in detail herein.

A protective coating particularly useful in the present invention is anodizing. Specific treatments of the electropolished material may include anodizing in a typical anodizing solution of, for example, about 10 to about 13% sulfuric acid, at about 70 to about 80° F. (21 to 27° C.), electrolytic coloring with 10% by volume CONSTANT COLOR 6000 (available from SIC Technologies, Inc., Atlanta, Ga) about 18 to about 20 g/L of sulfuric acid and about 20 to about 22 g/L of stannous tin at from about 70 to 90° F. (21 to 32° C.), inorganic or organic dying, or sealing with 2% by volume SEAL 2511 (available from SIC Technologies, Inc., Atlanta, Ga) at about 160 to about 180° F. (71 to 82° C.), pH 5.5–6.0, for about 10 minutes or with 3% by volume SEAL 2540 (available from SIC Technologies, Inc., Atlanta, Ga) at about 80 to about 90° F. (27 to 32° C.) at pH 6.0–6.2.

EXPERIMENTAL

The following prophetic example is put forth so as to provide those of ordinary skill in the art with a complete disclosure and description of how the compounds, compositions, articles, devices and/or processes claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° F. (° C.) or is at ambient temperature, and pressure is at or near atmospheric.

Prophetic Example

In a typical electropolishing sequence, an aluminum alloy material to be electropolished can be racked, i.e., clamped or otherwise secured to ensure good electrical contact with the rectifier. The aluminum alloy material can be positioned in such a manner as to allow the greatest area to be exposed parallel to the counter electrode(s) and to prevent gas pockets.

Prior to the immersion in the polishing solution, the aluminum alloy material can optionally be cleaned by immersion in a cleaning solution of 8 oz/gal of CLEANER 3390 (SIC Technologies, Inc., Atlanta, Ga.) maintained at about 150° F. (66° C.) for about 10 minutes. The aluminum alloy material can be removed from the cleaning solution and rinsed with water.

The aluminum alloy material can then optionally be treated with a desmutting solution comprising 20% by volume of DESMUT 1015 (SIC Technologies, Inc., Atlanta, Ga.), which comprises about 32.50% ferric sulfate, about 6.75% sulfuric acid, about 6.70% nitric acid, about 1.15% ammonium bifluoride, about 0.46% hydrogen peroxide and about 52.44% water, in an unheated bath for about 30 minutes. The duration of the cleaning process will vary primarily with the degree of undesirable materials present on the surface of the aluminum alloy material. The aluminum alloy material can be removed from the bath and again rinsed with water. As noted, use of a desmutting step prior to electropolishing has been found, in some aspects, to provide improved electropolishing in the processes of the present invention.

A polishing solution comprising EP8537 (SIC Technologies, Inc., Atlanta, Ga.), which comprises about 80% of a phosphoric acid solution, wherein the phosphoric acid solution comprises about 68.5% phosphoric acid, about 1.9% sodium hypophosphite, about 11% ethylene glycol, about 1.6% ethylene glycol n-butyl ether, about 2.2% glycolic acid and about 14.8% water, and about 10 g/L of dissolved aluminum can be maintained at a temperature of about 150±10° F. to about (66±6° C.) and can be agitated vigorously by bubbling air through the solution with an air back pressure of about 0.4 kPa.

The aluminum alloy material can be immersed in the polishing solution and made anodic (positive) and the counter electrode(s) made negative by applying a direct current of about 12 volts, supplied from a rectifier. The current density of the aluminum alloy material can be about 40 amps/ft$^2$ (430 amps/m$^2$). The aluminum alloy material can be electropolished for from about 4 minutes to about 8 minutes. After the electropolishing, the aluminum alloy material can be rinsed three times with water.

An aluminum alloy material treated in accordance with this method will exhibit a highly polished, mirror-like finish.

Throughout this application, various publications are referenced. The disclosures of these publications in their entireties are hereby incorporated by reference into this application in order to more fully describe the state of the art to which this invention pertains.

The invention has been described in detail. It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

I claim:

1. A process for electropolishing an aluminum alloy material comprising the steps of:
    a. providing a polishing solution comprising by weight:
        i. from about 55% to about 90% of a phosphoric acid solution, wherein the phosphoric acid solution comprises from about 60% to about 100% phosphoric acid;
        ii. from about 0.2% to about 20% of a hypophosphite-containing compound,
        wherein components i. and ii. are measured out of a total of 100% polishing solution;
    b. applying a mechanical force to the polishing solution, thereby providing an agitated polishing solution;
    c. immersing the aluminum alloy material in the polishing solution for from about 2 minutes to about 60 minutes; and
    d. making the aluminum alloy material anodic by applying a DC current concurrently with the immersing step;

thereby providing an electropolished aluminum alloy material.

2. The process of claim 1, wherein the polishing solution comprises:
    iii. from about 2% to about 30% of a polyol;
    iv. from about 1% to about 15% of a polyol ether;
    v. from about 2% to about 20% of an organic acid; and
    vi. water;
wherein components i. through vi. total 100% of the polishing solution.

3. The process of claim 1, wherein the DC current is from about 10 volts to about 48 volts.

4. The process of claim 1, wherein the polishing solution comprises from about 2 to about 40 grams dissolved aluminum per liter of polishing solution.

5. The process of claim 1, wherein the polishing solution comprises from about 2 to about 10 grams of dissolved aluminum per liter of polishing solution.

6. The process of claim 1, wherein the aluminum alloy material is subjected to one or more cleaning steps prior to immersing into the polishing solution, and wherein at least one of the cleaning steps comprises immersing of the aluminum alloy material in a solution comprising one or more of: ferric sulfate, peroxides, persulfates, perborates, sulfuric acid, nitric acid, hydrofluoric acid or ammonium biflouoride.

7. The process of claim 6, wherein at least one of the cleaning steps comprises immersing of the aluminum alloy material in a solution comprising ferric sulfate.

8. The process of claim 1, wherein the polishing solution is maintained at a temperature of from about 100° F. to about 200° F.

9. The process of claim 1, wherein the immersing step is conducted for from about 2 minutes to about 30 minutes.

10. The process of claim 1, wherein during the immersing step the aluminum alloy material has a current density of at least about 10 amps/ft$^2$.

11. The process of claim 1, wherein the aluminum alloy material comprises at least about 85% aluminum metal in the alloy.

12. The process of claim 1, wherein the aluminum alloy material comprises one or more of the following Aluminum Association designated alloys: 1050, 1060, 1100, 1145, 1175, 1200, 1230, 1235, 1345, 2024, 2219, 3003, 5252, 5657, 6063, 6061, 6463 or 7075.

13. The process of claim 1, wherein the aluminum alloy material comprises less than about 2% by weight silicon.

14. The process of claim 2, wherein the polishing solution comprises:
    i. from about 65% to about 80% of a concentrated phosphoric acid solution, wherein the phosphoric acid solution comprises from about 60% to about 100% phosphoric acid;
    ii. from about 0.2% to about 5% of a hypophosphite-containing compound;
    iii. from about 5% to about 15% of a polyol;
    iv. from about 1% to about 10% of a polyol ether;
    v. from about 5% to about 15% of an organic acid; and
    vi. water;
wherein components i. through vi. total 100% of the polishing solution.

15. The process of claim 1, wherein the agitation force is provided by one or more of: mechanical stirring or application of aeration.

16. The process of claim 1, wherein the process further comprises removing the aluminum alloy material from the polishing solution after the immersing step and subjecting the aluminum alloy material to one or more of the following steps: a rinsing step, a desmutting step or an anodizing step.

17. The process of claim 2, wherein the polyol comprises one or more of: ethylene glycol, glycerol, butanediols, propanediols, propylene glycol, diethylene glycol, polypropylene glycol or polyethylene glycol.

18. The process of claim 2, wherein the polyol ether comprises one or more of: ethylene glycol n-butyl ether, diethylene glycol n-butyl ether, dipropylene glycol monomethyl ether, ethylene glycol dimethyl ether, ethylene glycol diethyl ether or propylene glycol n-butyl ether.

19. The process of claim 2, wherein the organic acid comprises one or more of: α-hydroxy carboxylic acids, hydroxy acetic acid, glycolic acid, lactic acid, tartaric acid, glyceric acid, malic acid, maleic acid, mandelic acid, citric acid, ascorbic acid, succinic acid, gluconic acid, formic acid, pyruvic acid, propanoic acid, palmitic acid, butyric acid, oxalic acid, fumaric acid or itaconic acid.

20. The process of claim 19, wherein the organic acid comprises the α hydroxy carboxylic acid and the α-hydroxy carboxylic acid comprises one or more of: α-hydroxy acetic acid, glycolic acid, lactic acid, tartaric acid, glyceric acid, mandelic acid or citric acid.

21. The process of claim 1, wherein the hypophosphite-containing material comprises one or more of: sodium hypophosphite, calcium hypophosphite or ammonium hypophosphite.

22. The process of claim 1, wherein the aluminum alloy material is longilateral or irregular in shape.

* * * * *